(12) United States Patent
Zhao

(10) Patent No.: US 12,500,554 B2
(45) Date of Patent: Dec. 16, 2025

(54) METHOD FOR IMPROVING SOUND PLAY EFFECT AND RELATED APPARATUS

(71) Applicant: Honor Device Co., Ltd., Shenzhen (CN)

(72) Inventor: Jing Zhao, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 466 days.

(21) Appl. No.: 17/999,527

(22) PCT Filed: May 17, 2022

(86) PCT No.: PCT/CN2022/093399
§ 371 (c)(1),
(2) Date: Nov. 21, 2022

(87) PCT Pub. No.: WO2023/020050
PCT Pub. Date: Feb. 23, 2023

(65) Prior Publication Data
US 2025/0080062 A1   Mar. 6, 2025

(30) Foreign Application Priority Data

Aug. 19, 2021   (CN) .......................... 202110953436.2

(51) Int. Cl.
*H03F 3/183* (2006.01)
*H03F 3/217* (2006.01)
*H04R 3/04* (2006.01)

(52) U.S. Cl.
CPC .......... *H03F 3/183* (2013.01); *H03F 3/2173* (2013.01); *H04R 3/04* (2013.01); *H03F 2200/03* (2013.01);
(Continued)

(58) Field of Classification Search
CPC .... H03F 3/183; H03F 3/2173; H03F 2200/03; H03F 2200/258; H03F 2200/297;
(Continued)

(56) References Cited

U.S. PATENT DOCUMENTS 4,982,435 A   1/1991   Kato
9,634,621 B1   4/2017   Ilango et al.
(Continued)

FOREIGN PATENT DOCUMENTS

CN   103414444 A   11/2013
CN   106953608 A   7/2017
(Continued)

OTHER PUBLICATIONS

Anonymous, "Audio Amplifier with IV Sense", Richtek, RT5510, Oct. 1, 2019, pp. 1-52.

*Primary Examiner* — Carolyn R Edwards
*Assistant Examiner* — Friedrich Fahnert
(74) *Attorney, Agent, or Firm* — SLATER MATSIL, LLP

(57) ABSTRACT

An electronic device includes devices such as a power source, a power amplifier, and a speaker. The electronic device may supply an adaptable output voltage to the power amplifier based on a detected operating state of the speaker. Specifically, by designing a connecting circuit between the power source and the power amplifier, when the power amplifier operates on different circuits, the power source can provide different output voltages for the power amplifier, and then provide an adaptable driving power for the speaker.

16 Claims, 3 Drawing Sheets

(52) U.S. Cl.
CPC .. *H03F 2200/258* (2013.01); *H03F 2200/297* (2013.01)

(58) Field of Classification Search
CPC .... H03F 2200/511; H03F 1/025; H03F 3/187; H03F 2200/507; H04R 3/04; H04R 2201/028; H04R 3/00; H04R 2430/00; Y02D 30/70
USPC .......................................................... 381/120
See application file for complete search history.

(56) References Cited

U.S. PATENT DOCUMENTS

| | | |
|---|---|---|
| 2007/0098190 A1 | 5/2007 | Young-Suk et al. |
| 2013/0083947 A1 | 4/2013 | Sven et al. |
| 2016/0142832 A1 | 5/2016 | Hillbratt et al. |
| 2017/0310280 A1 | 10/2017 | Labundy et al. |
| 2017/0359037 A1* | 12/2017 | Høyerby ............... H03F 3/2173 |
| 2018/0123451 A1 | 5/2018 | Larsen et al. |
| 2018/0124529 A1 | 5/2018 | Larsen et al. |
| 2018/0352329 A1* | 12/2018 | Klingler ............... H04R 1/2888 |

FOREIGN PATENT DOCUMENTS

| | | |
|---|---|---|
| CN | 110022515 A | 7/2019 |
| CN | 111510803 A | 8/2020 |
| CN | 112787607 A | 5/2021 |
| JP | 2000165152 A | 6/2000 |
| WO | 2019177806 A1 | 9/2019 |

* cited by examiner

METHOD FOR IMPROVING SOUND PLAY EFFECT AND RELATED APPARATUS

CROSS-REFERENCE TO RELATED APPLICATIONS

This application is a national stage of International Application No. PCT/CN2022/093399, filed on May 17, 2022, which claims priority to Chinese Patent Application No. 202110953436.2, filed on Aug. 19, 2021. The disclosures of both of the aforementioned application are hereby incorporated by reference in their entireties.

TECHNICAL FIELD

This application relates to the field of hardware technologies, and in particular, to a method for improving a sound play effect and a related apparatus.

BACKGROUND

With the popularization of multimedia devices, such as a mobile phone, a notebook, and sound equipment, users have increasingly high requirements for audio play quality of the multimedia devices. The sound play quality mainly depends on a frequency domain characteristic and linear distortion, and in particular, to a low frequency. Because the low frequency occupies 70% of the whole audio power, sound quality of the low frequency determines a user's auditory experience. In addition, the user's auditory experience in the low frequency is mainly loudness, and loudness of a played sound depends on an input power and conversion efficiency of an audio power amplifier.

Based on the foregoing problems, how to improve a sound play effect is an urgent problem to be resolved.

SUMMARY

This application provides a method for improving a sound play effect and a related apparatus. In the method, an electronic device may supply an adaptable output voltage to a power amplifier based on a detected operating state of a speaker, so as to provide an adaptable driving power for the speaker, so that the speaker outputs better sound quality and power consumption is reduced.

According to a first aspect, this application provides an electronic device, and the electronic device includes a power source, a processor, a voltage regulation unit, a power amplifier, and a speaker. The power source and the processor are separately connected to the voltage regulation unit, and the processor is further connected to the power amplifier. The voltage regulation circuit is connected to the power amplifier, and the power amplifier is connected to the speaker. The power source is configured to output a first voltage to the voltage regulation unit. The processor is configured to output an audio electrical signal to the power amplifier, and control, based on an audio frequency, the voltage regulation unit to adjust the first voltage to a second voltage and output the second voltage to the power amplifier. The audio frequency is negatively correlated with the second voltage, to be specific, the lower the audio frequency is, the higher the second voltage is. The power amplifier is configured to amplify an output power of the audio electrical signal under driving of the second voltage. The second voltage is positively correlated with the output power, to be specific, the higher the second voltage is, the higher the output power is. The speaker is configured to convert the amplified audio electrical signal into an audio signal.

After the electronic device provided in the first aspect is used, when an audio of the electronic device is played, an adaptable voltage may be provided for the power amplifier based on the audio frequency. When the audio frequency is lower, the electronic device may provide a higher voltage, so that an audio play effect is better.

With reference to the electronic device provided in the first aspect, the processor is further configured to obtain the audio frequency in advance; or the processor is further configured to receive information that is used to indicate the audio frequency and that is fed back by the power amplifier.

In this case, the electronic device may obtain the audio frequency in various manners and provide the adaptable voltage based on the audio frequency, thereby improving implementability of this solution.

With reference to the electronic device provided in the first aspect, the voltage regulation unit includes a first circuit, a second circuit, and a third circuit. Values of the second voltage include a first value, a second value, and a third value, and the first value, the second value and the third value increase successively. The first circuit is configured to adjust the first voltage to the second voltage of the first value, the second circuit is configured to adjust the first voltage to the second voltage of the second value, and the third circuit is configured to adjust the first voltage to the second voltage of the third value. That the processor controls the voltage regulation unit to adjust the first voltage to the second voltage and provide the second voltage for the power amplifier specifically includes: when the audio frequency is higher than a first preset frequency, control the first circuit of the voltage regulation unit to operate; or when the audio frequency is lower than or equal to the first preset frequency and is higher than a second preset frequency, control the second circuit of the voltage regulation unit to operate; or when the audio frequency is lower than or equal to the second preset frequency, control the third circuit of the voltage regulation unit to operate.

In this case, the electronic device may control different circuits to operate based on the audio frequency, so that the adaptable voltage is provided for the power amplifier, thereby improving the sound play effect.

With reference to the electronic device provided in the first aspect, when the audio frequency is lower than the second preset frequency, the audio frequency is negatively correlated with the third value, to be specific, the lower the audio frequency is, the larger the third value is.

In this case, because a low frequency signal occupies 70% of the whole audio power in a music signal, when the electronic device outputs a low frequency audio signal, the electronic device may further dynamically adjust a corresponding circuit to output a matching voltage based on a frequency of the low frequency audio signal, so as to improve a music play effect.

With reference to the electronic device provided in the first aspect, the first value is equal to half of a first voltage value; the second value is equal to the first voltage value; and the third value is greater than the first voltage value.

In this case, the electronic device may control different circuits to operate based on the audio frequency, so that the adaptable voltage can be provided for the power amplifier, thereby improving the sound play effect and further reducing power consumption of the electronic device.

With reference to the electronic device provided in the first aspect, that the processor controls the third circuit of the voltage regulation unit to operate specifically includes: the processor controls, based on the audio frequency, the third circuit to operate by using a pulse width modulation method or by controlling a register inside the processor.

In this case, the electronic device can adjust a magnitude of an output voltage of the circuit in various manners, thereby improving the implementability of this solution With reference to the electronic device provided in the first aspect, the first circuit includes a charge bump and a first switch, and the charge chump is connected in series with the first switch. The processor is specifically configured to control the first switch to be turned on when the audio frequency is higher than the first preset frequency. The second circuit includes a second switch, and the processor is specifically configured to control the second switch to be turned on when the audio frequency is lower than or equal to the first preset frequency and is higher than the second preset frequency. The third circuit includes a boost circuit, and the processor is specifically configured to control the boost circuit to be turned on when the audio frequency is lower than the second preset frequency.

With reference to the electronic device provided in the first aspect, the foregoing charge bump is a 2:1 charge bump, and the 2:1 charge bump is configured to adjust the first voltage to the second voltage of the first value, and the first value is half of the first voltage value.

According to a second aspect, this application provides a method for improving a sound play effect, and the method is applied to a power source, a processor, a voltage regulation unit, a power amplifier, and a speaker. The power source and the processor are separately connected to the voltage regulation unit, and the processor is further connected to the power amplifier. The voltage regulation circuit is connected to the power amplifier, and the power amplifier is connected to the speaker. The power source is configured to output a first voltage to the voltage regulation unit. The processor is configured to input an audio electrical signal to the power amplifier, and control, based on an audio frequency, the voltage regulation unit to adjust the first voltage to a second voltage and output the second voltage to the power amplifier. The audio frequency is negatively correlated with the second voltage. The power amplifier is configured to amplify an output power of the audio electrical signal under driving of the second voltage. The second voltage is positively correlated with the output power. The speaker is configured to convert the amplified audio electrical signal into an audio signal.

After the method provided in the first aspect is implemented, when the audio of the electronic device is played, an adaptable voltage may be provided for the power amplifier based on the audio frequency. When the audio frequency is lower, the electronic device may provide a higher voltage, so that an audio play effect is better.

With reference to the method provided in the second aspect, the processor of the electronic device is further configured to obtain the audio frequency in advance; or the processor is further configured to receive information that is used to indicate the audio frequency and that is fed back by the power amplifier. The higher the output power is, the lower the audio frequency is, and the higher the second voltage is.

In this case, the electronic device may obtain the audio frequency in various manners and provide the adaptable voltage based on the audio frequency, thereby improving implementability of this solution.

With reference to the method provided in the second aspect, the voltage regulation unit includes a first circuit, a second circuit, and a third circuit. Values of the second voltage include a first value, a second value, and a third value, and the first value, the second value and the third value increase successively. The first circuit is configured to adjust the first voltage to the second voltage of the first value, the second circuit is configured to adjust the first voltage to the second voltage of the second value, and the third circuit is configured to adjust the first voltage to the second voltage of the third value. That the processor controls the voltage regulation unit to adjust the first voltage to the second voltage and provide the second voltage for the power amplifier specifically includes: when the audio frequency is higher than a first preset frequency, control the first circuit of the voltage regulation unit to operate; or when the audio frequency is lower than or equal to the first preset frequency and is higher than a second preset frequency, control the second circuit of the voltage regulation unit to operate; or when the audio frequency is lower than or equal to the second preset frequency, control the third circuit of the voltage regulation unit to operate.

With reference to the method provided in the second aspect, when the audio frequency is lower than the second preset frequency, the lower the audio frequency is, the larger the third value is.

In this case, because a low frequency signal occupies 70% of the whole audio power in a music signal, when the electronic device outputs a low frequency audio signal, the electronic device may further dynamically adjust a corresponding circuit to output a matching voltage based on a frequency of the low frequency audio signal, so as to improve a music play effect.

With reference to the electronic device provided in the first aspect, the first value is equal to half of a first voltage value; the second value is equal to the first voltage value; and the third value is greater than the first voltage value.

With reference to the method provided in the second aspect, that the processor controls the third circuit of the voltage regulation unit to operate specifically includes: the processor controls, based on the audio frequency, the third circuit to operate by using a pulse width modulation method or by controlling a register inside the processor.

With reference to the method provided in the second aspect, the first circuit includes a charge bump and a first switch, and the charge chump is connected in series with the first switch. The processor is specifically configured to control the first switch to be turned on when the audio frequency is higher than the first preset frequency. The second circuit includes a second switch, and the processor is specifically configured to control the second switch to be turned on when the audio frequency is lower than or equal to the first preset frequency and is higher than the second preset frequency. The third circuit includes a boost circuit, and the processor is specifically configured to control the boost circuit to be turned on when the audio frequency is lower than the second preset frequency.

With reference to the method provided in the second aspect, the foregoing charge bump is a 2:1 charge bump, and the 2:1 charge bump is configured to adjust the first voltage to the second voltage of the first value. The first value is half of the first voltage value.

According to a third aspect, this application provides a chip. The chip is applied to an electronic device, and the chip includes one or more processors. The processors are configured to invoke a computer instruction to enable the electronic device to perform the method according to any one of the second aspect.

According to a fourth aspect, this application provides a computer readable storage medium, including an instruction. When the instruction is run on an electronic device, the electronic device is enabled to perform the method according to any one of the second aspect.

According to a fifth aspect, this application provides an electronic device, and the electronic device includes one or more processors and one or more memories. The one or more memories are coupled with the one or more processors, and the one or more memories are configured to store computer program code. The computer program code includes a computer code, and when the one or more processors execute the computer instruction, the electronic device is enabled to perform the method according to the foregoing implementations of the second aspect.

DETAILED DESCRIPTION OF ILLUSTRATIVE EMBODIMENTS

The following describes technical solutions in embodiments of this application clearly and in detail with reference to accompanying drawings. In descriptions of embodiments of this application, unless otherwise specified, "/" means "or", for example, A/B may mean "A or B"; "and/or" used herein is only used to describe an association relationship between associated objects, and indicates that three relationships may exist. For example, "A and/or B" may indicate the following: Only A exists, both A and B exist, and only B exists.

The terms "first" and "second" in the following are merely intended for a purpose of description, and shall not be understood as an indication or implication of relative importance or an implicit indication of a quantity of indicated technical features. Therefore, features defined with "first" and "second" may explicitly or implicitly include one or more of such features. In the descriptions of the embodiments of this application, unless otherwise stated, "a plurality of" means two or more.

An "embodiment" in this application means that a specific feature, structure, or characteristic described with reference to the embodiment may be included in at least one embodiment of this application. The phrase appearing at various locations in the specification does not necessarily refer to a same embodiment, nor is a separate or alternative embodiment mutually exclusive with another embodiment. A person skilled in the art explicitly and implicitly understand that the embodiments described in this application may be combined with another embodiment.

Currently, more and more electronic devices have the function of producing a sound, and these electronic devices that can produce a sound usually have an audio power amplifier to play a sound. An audio power amplifier refers to a device that reconstructs an input audio signal on an output element that generates a sound, and volume and a power level of the reconstructed signal are more ideal. For example, in an audio system of an electronic device, an audio electrical signal needs to be first amplified by using an audio power amplifier, and an output amplified audio electrical signal has enough energy to drive a speaker to convert the audio electrical signal into a sound signal to output a sound.

Figure 1:
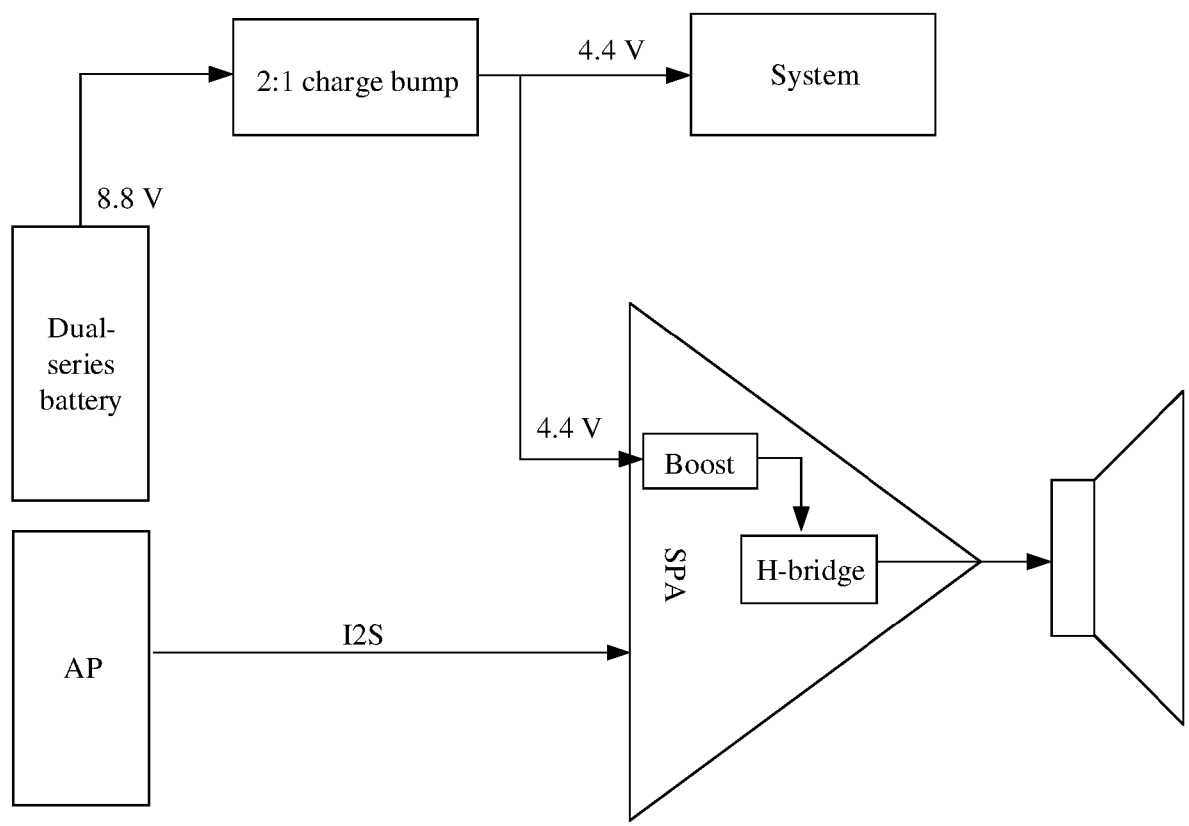
FIG. 1 is a topology diagram of a circuit of an audio power amplifier according to an embodiment of this application.

Refer to FIG. 1, FIG. 1 is a topology diagram of an example of a circuit of an audio power amplifier.

As shown in FIG. 1, the topology diagram of the circuit is shown by using an example in which a smart power amplifier (Smart power amplifier, SPA) drives a speaker in a mobile phone.

An input end of the SPA is connected to a system power source voltage of 4.4 V, and a boost step-up circuit is disposed inside the SPA. The boost step-up circuit can provide a higher input power for the speaker after step-up, thereby driving the speaker to sound. To enable the speaker to output the best sound quality and loudness, a driving power of the speaker needs to be increased.

Energy distribution of a music signal is mainly concentrated in a low and medium frequency part, and the low and medium frequency part needs a power source that can provide a high current. When a strong signal occurs, an output voltage is high and a current is high, and in this case, over current protection (Over current protection, OCP) in the boost step-up circuit inside the SPA is triggered, thereby resulting in a limitation on a boost output voltage. Therefore, the SPA cannot provide enough driving power for the speaker. To avoid clipping distortion of an output audio signal, the SPA needs to perform amplitude compression on an input audio signal, resulting in insufficient output dynamics of the speaker, which results in poor sound quality of the output sound, and affects a user's auditory experience.

In addition, in a low frequency response, a high output power of the SPA is required, that is, a high driving power of the speaker is required. In this case, a voltage difference of the boost step-up circuit is large, it can be learned that, according to a formula $V_{in} \times I_{in} \times \eta = V_{out} \times I_{out}$, an effect of power efficiency $\eta$ is temporarily ignored. When an output voltage is a specific value, a smaller input voltage leads to a higher input current, which causes a circuit board to heat, and causes an input voltage to fall, thereby limiting an output current and reducing efficiency, and resulting in further compression of an output low frequency signal and a poor sound effect.

To resolve the foregoing problems, an embodiment of this application provides a method for improving a sound play effect and a related apparatus. The method is applied to an electronic device, and the electronic device includes components, such as a power source, a voltage regulation unit, a processor, a power amplifier, and a speaker. In the method, the electronic device may supply an adaptable output voltage to the power amplifier based on an operating state of the speaker detected by the processor. Specifically, by designing the voltage regulation unit between the power source and the power amplifier, when the voltage regulation unit operates on different circuits, the power source can provide different input voltages for the power amplifier, and then provide an adaptable driving power for the speaker, so that the speaker outputs better sound quality.

Specially, when the electronic device detects that the speaker is operating at a high power, that is, when the driving power required for outputting a low frequency audio signal by the speaker is high, a high-voltage circuit that controls the power source and the power amplifier is activated. The power source and the voltage are specifically stepped up by the high-voltage circuit by using the step-up circuit, and then are connected to the power amplifier. The power amplifier amplifies a high input power to a higher output power, to drive the speaker to output a sound, thereby improving sound play dynamics, and further improving a sound play effect.

In this embodiment of this application, the operating state of the foregoing speaker includes any one or more of the following information: an operating voltage, an operating current, a power, an audio frequency, or the like. This is not limited in this embodiment of this application. The power is used as an example. When the audio frequency output by the speaker is low, a corresponding power is high.

Figure 3:
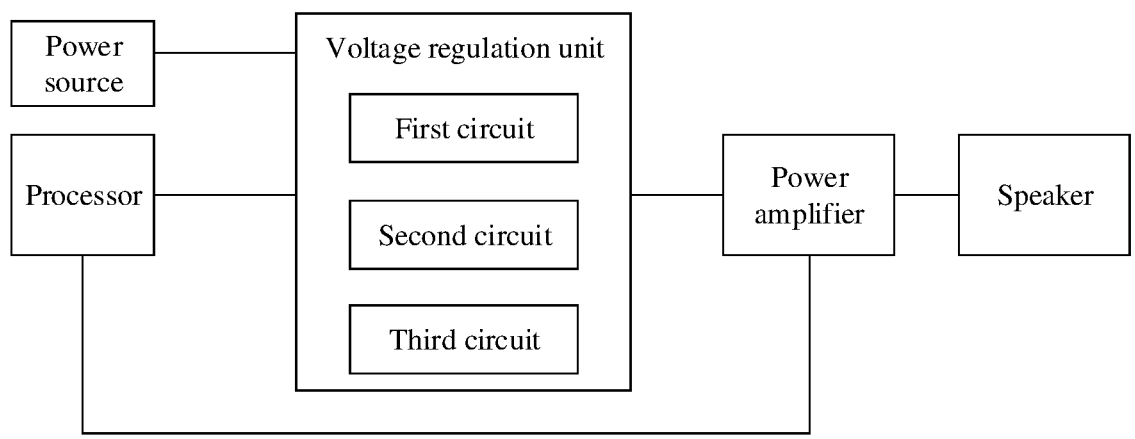
FIG. 3 is a topology diagram of another circuit of an audio power amplifier according to an embodiment of this application.

In this embodiment of this application, for details about a design of the voltage regulation unit between the power source and the power amplifier, reference may be made to detailed description of FIG. 3, and details are not described herein.

It can be learned that, after the method for improving a sound play effect provided in this embodiment of this application is implemented, overall sound quality of a sound output by the electronic device is naturally realistic and effectively eliminates a noise in music playing, an output sound is very bright, and presentation of a bass effect is also very thick, thereby providing a clear, full, shocking, and deep auditory experience to a user's ears, and improving a volume level of the electronic device. In addition, power consumption of the electronic device is further reduced.

Figure 2:
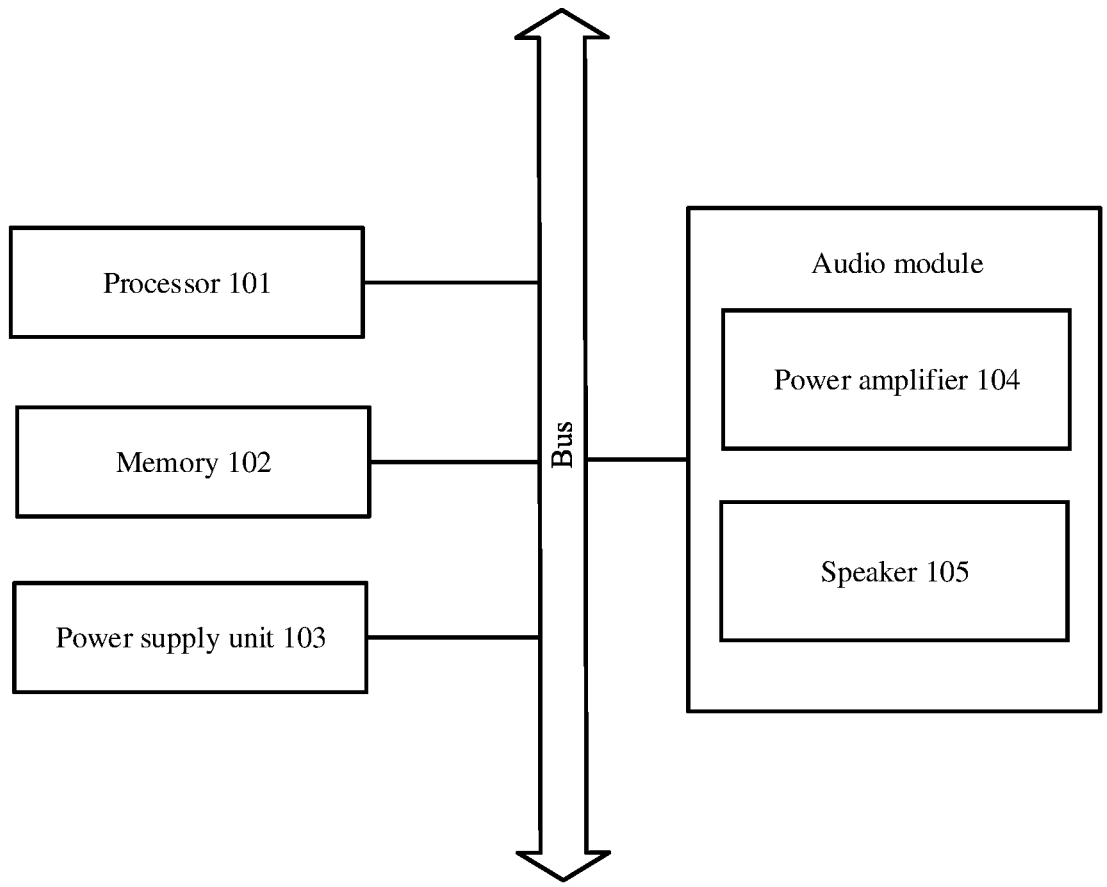
FIG. 2 is a schematic diagram of a software and hardware architecture of an electronic device according to an embodiment of this application.

With reference to FIG. 2, the following describes a software and hardware architecture of an electronic device according to this application.

In this embodiment of this application, the electronic device may be a tablet computer, a desktop computer, a laptop computer, a handheld computer, a notebook computer, a ultra-mobile personal computer (ultra-mobile personal computer, UMPC), a netbook, and a cellular phone, a personal digital assistant (personal digital assistant, PDA), an augmented reality (augmented reality, AR) device, a virtual reality (virtual reality, VR) device, an artificial intelligence (artificial intelligence, AI) device, a wearable device, a vehicle-mounted device, a smart home device, and/or a smart city device. This is not limited in this embodiment of this application.

As shown in FIG. 2, the electronic device includes a processor 101, a memory 102, a power supply unit 103, and an audio module. In this embodiment of this application, the audio module may include a power amplifier 104, a speaker 105, and the like. The foregoing plurality of parts may transmit data by using a bus.

The processor 101 may include one or more processing units. For example, the processor 101 may include an application processor (application processor, AP), a modem processor, a controller, a memory, an audio codec, a digital signal processor (digital signal processor, DSP), and/or a baseband processor. Different processing units may be independent devices, or may be integrated into one or more processors. The controller may generate an operation control signal based on an instruction operation code and a time sequence signal to complete control of fetching the instruction and executing the instruction.

In this embodiment of this application, the AP can detect the operating state of the speaker and control, based on the operating state of the speaker, the power supply unit 103 to supply an adaptable voltage to the power amplifier 104.

In this embodiment of this application, the audio codec may output a decoded audio signal to the power amplifier 104, and the power amplifier 104 may send the amplified audio signal to the speaker to output a sound.

The memory may further be disposed in the processor 101 to store an instruction and data. In some embodiments, the memory in the processor 101 is a cache memory. The memory can store an instruction or data that is just used or used cyclically by the processor 101. If the processor 101 needs to use the instruction or the data again, the instruction or the data can be directly invoked from the memory. Repeated access is avoided, and a waiting time of the processor 101 is reduced, thereby improving efficiency of a system.

In some embodiments, the processor 101 may include one or more interfaces. The interface may be an inter-integrated circuit (inter-integrated circuit, I2C) interface, an inter-integrated circuit sound (inter-integrated circuit sound, I2S) interface, a pulse code modulation (pulse code modulation, PCM) interface, a universal asynchronous receiver/transmitter (universal asynchronous receiver/transmitter, UART) interface, a mobile industry processor interface (mobile industry processor interface, MIPI) interface, a general-purpose input/output (general-purpose input/output, GPIO) interface, a subscriber identity module (subscriber identity module, SIM) interface, a universal serial bus (universal serial bus, USB) interface, and/or the like.

The I2C interface is a bidirectional synchronous serial bus, and includes a serial data line (serial data line, SDA) and a serial clock line (serial clock line, SCL). In some embodiments, the processor 101 may include a plurality of groups of I2C buses. The processor 101 may be coupled to a touch sensor, a charger, a flash, a camera, and the like by using different I2C bus interfaces. For example, the processor 101 may be coupled to the touch sensor by using the I2C interface, so that the processor 101 communicates with the touch sensor by using the I2C bus interfaces to implement a touch function of the electronic device 100.

The I2S interface can be used for audio communication. In some embodiments, the processor 101 may include a plurality of groups of I2S buses. The processor 101 may be coupled to the audio module by using the I2S buses to implement communication between the processor 101 and the audio module.

The PCM interface can also be used for audio communication to sample, quantize, and encode an analog signal. In some embodiments, the audio module is coupled to a wireless communication module by using a PCM bus interface. In some embodiments, the audio module may alternatively transmit an audio signal to a wireless communication module by using a PCM interface to implement a function of answering a call. Both the I2S interface and the PCM interface may be used for audio communication.

The USB interface is an interface that complies with USB standard specifications, and may be specifically a Mini USB interface, a Micro USB interface, a USB Type C interface, and the like. The USB interface may be connected to a charger to charge the electronic device, may be configured to transmit data between the electronic device and a peripheral device, or may be connected to an external memory, or the like.

It can be understood that the interface connection relationship between the modules illustrated in the embodiments of this application is merely an example for description, and does not constitute a limitation on the structure of the electronic device. In some other embodiments of this application, the electronic device may alternatively use an interface connection mode that is different from those in the foregoing embodiments, or use a combination of a plurality of interface connection modes.

The memory 102 may be an internal memory of the electronic device, or may be an external memory connected to the electronic device. The internal memory may include one or more random access memories (random access memory, RAM) and one or more non-volatile memories (Non-volatile memory, NVM). In this embodiment of this application, the NVM may store information about an area reached by the user and a stay time in the area.

The random access memory may include a static random-access memory (static random-access memory, SRAM), a dynamic random access memory (dynamic random access memory, DRAM), a synchronous dynamic random access memory (synchronous dynamic random access memory, SDRAM), a double data rate synchronous dynamic random access memory (double data rate synchronous dynamic random access memory, DDR SDRAM, for example, the fifth generation DDR SDRAM is usually referred to as DDR5 SDRAM), and the like.

The non-volatile memories may include a magnetic disk memory and a flash memory (flash memory).

The flash memory may include a NOR FLASH, a NAND FLASH, a 3D NAND FLASH, and the like according to an operating principle. The flash memory may include a single-level cell (single-level cell, SLC), a multi-level cell (multi-level cell, MLC), a triple-level cell (triple-level cell, TLC), a quad-level cell (quad-level cell, QLC) and the like according to a potential level in a memory cell. The flash memory may include a universal flash storage (English: universal flash storage, UFS), an Embedded multimedia memory card (embedded multi media Card, eMMC), and the like according to a storage specification.

The random access memory may be directly read and written by the processor 101, and may be configured to store an executable program (for example, a machine instruction) of an operating system or another running program, and may be further configured to store data of a user and data of an application.

The non-volatile memory may also store an executable program, data of a user, data of an application, and the like, which may be loaded into the random access memory in advance for directly reading and writing by the processor 101.

The external memory interface may be configured to connect to an external memory card, so as to expand a storage capacity of the electronic device. The external non-volatile memory communicates with the processor 101 by using the external memory interface, so as to implement a data storage function. For example, music, video, and other files are stored in the external memory card.

The power supply unit 103 may specifically include a charging management module and a power source management module. The charging management module is configured to receive a charging input from the charger. The charger may be a wireless charger, or may be a wired charger. In some embodiments of wired charging, the charging management module may receive the charging input of the wired charger by using the USB interface. In some embodiments of wireless charging, the charging management module can receive a wireless charging input by using a wireless charging coil of the electronic device. When charging the battery, the charging management module can further supply power to the electronic device by using the power management module. The power management module is configured to connect the battery, the charging management module, and the processor 101. The power source management module receives an input from the battery and/or an input from the charging management module, and supplies power to the processor 101, the memory 102, the audio module, and the like. The power source management module may be further configured to monitor parameters such as a battery capacity, a quantity of battery cycles, and a battery health state (leakage and impedance). In some other embodiments, the power source management module may alternatively be disposed in the processor 101. In some other embodiments, the power source management module and the charging management module may alternatively be disposed in a same device.

The audio module is configured to convert digital audio information into an analog audio signal for outputting, and is also configured to convert an analog audio input into a digital audio signal. The audio module may be further configured to encode and decode audio signals. In some embodiments, the audio module may be disposed in the processor 101, or some functional modules of the audio module may be disposed in the processor 101.

It can be understood that the structure of the electronic device shown in FIG. 2 does not constitute a specific limitation on the electronic device. In some other embodiments of this application, the electronic device may include more or fewer components than those shown in the figure, combine some components, split some components, or have different component arrangements. The components shown in the figure may be implemented by hardware, software, or a combination of software and hardware.

Based on the foregoing description of the electronic device provided in this application, the following describes the components included in a circuit of an audio power amplifier provided in this embodiment of this application with reference to FIG. 3.

As shown in FIG. 3, the circuit of an audio power amplifier includes a power source, a voltage regulation unit, a power amplifier, a speaker, a processor, and the like, where
  the power source can supply power to the power amplifier by using the voltage regulation unit. In this embodiment of this application, a voltage output by a dual-series battery may be referred to as a first voltage.

The voltage regulation unit refers to a plurality of circuits connected between the power source and the power amplifier, and different circuits may adjust a voltage output by the power source. The plurality of circuits may include, for example, a first circuit, a second circuit, and a third circuit. A quantity of circuits included in the voltage regulation unit is not limited in this embodiment of this application. In this embodiment of this application, a voltage output by the voltage regulation unit may be referred to as a second voltage. The second voltage includes voltage values such as a first value (for example, 4.4 V), a second value (for example, 8.8 V), and a third value (for example, 8.8 V-15 V).

In a possible implementation of this application, the foregoing voltage regulation unit may be an independent device, may be integrated into the processor, or may be integrated into the power amplifier. This is not limited in this embodiment of this application.

The processor may detect an operating state of the speaker, and control, based on the operating state of the speaker, the voltage regulation unit to adjust the first voltage to the second voltage and output the second voltage to the power amplifier. In a possible implementation, the processor may obtain the operating state of the speaker in advance based on the information of an audio file. In this case, the operating state of the speaker is specifically an audio frequency. In another possible implementation, the processor may obtain the operating state of the speaker based on feedback information of the power amplifier. Specifically, the processor stores a correspondence between feedback information of the power amplifier and the audio frequency. The processor may obtain the audio frequency based on the correspondence, and the feedback information may include any one or more of the following items: an output power, an output voltage, and an output current of the power amplifier. Then, the processor may control the circuit corresponding to the voltage regulation unit to operate, based on the stored correspondence between the audio frequency and the second voltage, to output the second voltage adaptable to the frequency of the audio. When the audio frequency is lower, the second voltage output by the voltage regulation unit controlled by the processor is higher, and an output power of a corresponding power amplifier is higher.

In some other embodiments of this application, the processor may directly control, based on a stored correspondence between feedback information of the power amplifier and the second voltage, a circuit corresponding to the voltage regulation unit to operate to output the adaptable second voltage. When an output power of the power amplifier is higher, the second voltage output by the voltage regulation unit controlled by the processor is higher, and the output power of the corresponding power amplifier is higher.

The following uses an example to describe a specific implementation in which the processor controls the voltage regulation unit to output the second voltage.

When the output power of the power amplifier is lower than a first preset power, or the audio frequency is higher than a first preset frequency (for example, 2000 Hz), it is determined that the first circuit is operating and outputs the second voltage of the first value; or when the output power of the power amplifier is lower than a second preset power and is higher than or equal to the first preset power, or the audio frequency is higher than the second preset frequency (for example, 800 Hz) and is lower than or equal to the first preset frequency, it is determined that the second circuit is operating and outputs the second voltage of the second value; or when the output power of the power amplifier is higher than or equal to the second preset power, or when the audio frequency is lower than or equal to the second preset frequency, it is determined that the third circuit is operating and outputs the second voltage of the third value.

It can be understood that values of the first preset frequency and the second preset frequency may be set by a developer based on a type of an audio service in which the electronic device provided in this application is to be used. For example, when the electronic device is specially used for pop music and rock music, because there are many drum sounds and gun sounds in such music, and audio frequencies are mainly low frequencies, values of the first frequency and the foregoing second frequency may be set to low values; or when the electronic device is specially used for folk music, and audio frequencies are mainly high frequencies, the values of the first frequency and the foregoing second frequency may be set to high values. The first preset frequency and the second preset frequency are not limited in this embodiment of this application.

It should be noted that the processor may control an audio system to operate on different circuits to provide an adaptable voltage for the power amplifier, and the power amplifier may further adjust an operating voltage of the audio system to operate on a specific circuit to provide the adaptable voltage for the power amplifier. The following will describe an example in which the processor adjusts the voltage of the third circuit in detail. Details are not described herein.

The power amplifier can output a power that is higher than an input power to drive a load, for example, the speaker, to sound. In this embodiment of this application, the power amplifier may have a feedback function. To be specific, the power amplifier can detect the operating state of the speaker, and feed back related data of the operating state to the processor, so that the processor monitors the operating state of the speaker in real time, and dynamically adjusts, based on the operating state, an input voltage of the power amplifier to provide an adaptable operating voltage for the speaker.

A speaker (Speaker) is also referred to as a "horn", and is configured to convert an audio electrical signal into a sound signal. The power amplifier may input amplified audio electric energy to the speaker, so that the speaker can vibrate a paper cone or a film in the speaker and resonate (resonate) with surrounding air to sound based on an electromagnetic, a piezoelectric or an electrostatic effect, thereby completing a process of converting electric energy to mechanical energy and then to acoustic energy. The speaker is a complex device in a multimedia module of an audio device or an electronic device. However, for an audio effect, the speaker is the most important component. The speaker falls into a plurality of types, such as a tapered speaker, a flat-panel speaker, a dome speaker, a simple speaker, a strip high-pitch speaker, and a thin panel speaker, according to classification based on a shape of a diaphragm and a radiator; an electric type (namely, a moving coil type), an electrostatic type (namely, a capacitive type), an electromagnetic type (namely, a reed type), and a piezoelectric type, namely, a crystal type, according to a classification based on operating principles of energy conversion. Because the electric speaker has advantages such as good electroacoustic performance, a solid structure, and low costs, the electric speaker is widely used in mobile multimedia devices. A specific type of the speaker is not limited in this embodiment of this application.

It can be understood that FIG. 3 only shows an implementation of a topology structure of an example of a circuit of an audio power amplifier. The topology structure of the circuit of an audio power amplifier provided in this application may include more or fewer elements than those shown in FIG. 3, for example, may further include a fourth circuit, or may further include a plurality of power amplifiers, or the like. In addition, physical positions of components of the topology structure of the circuit of an audio power amplifier provided in this application are not limited to those shown in FIG. 3. For example, in some other embodiments of this application, any one or more of the first circuit, the second circuit, and the third circuit may be integrated into a power amplifier, and this is not limited in this embodiment of this application.

Figure 4:
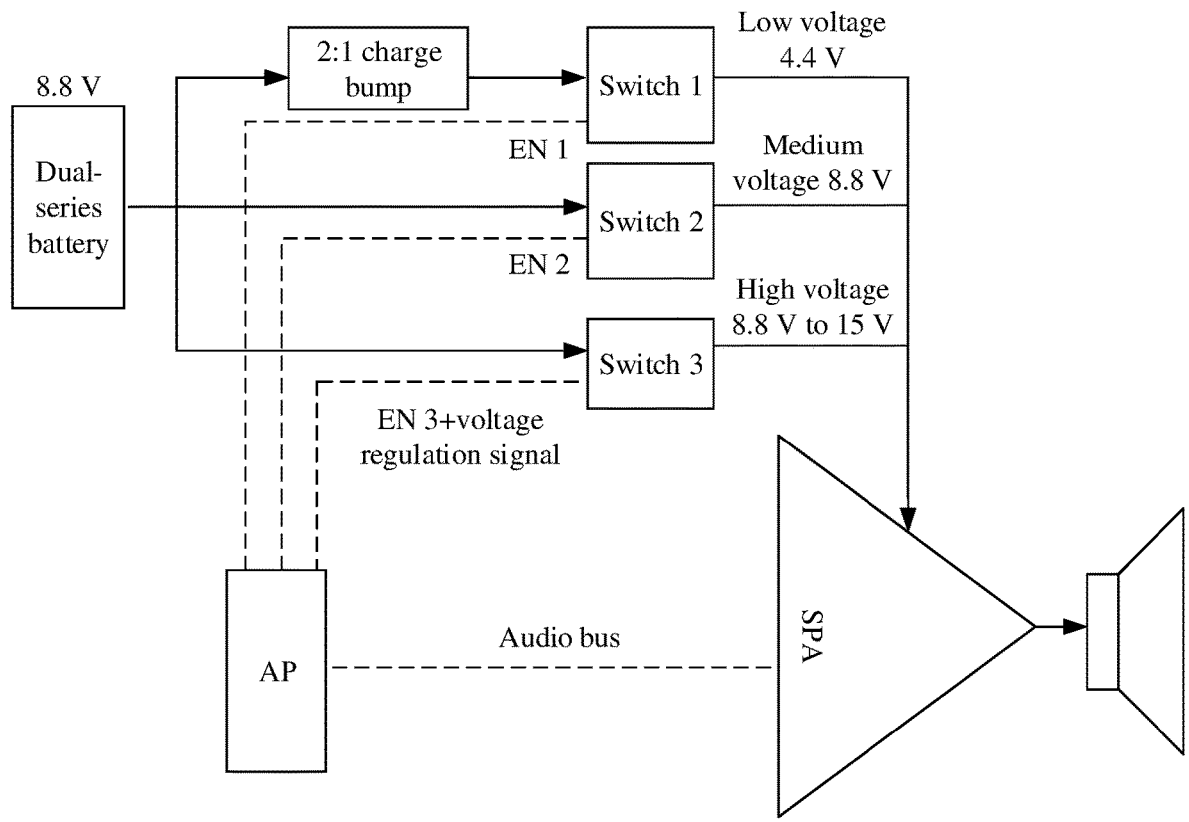
FIG. 4 is a diagram of another circuit of an audio power amplifier according to an embodiment of this application.

The following describes a circuit of an audio power amplifier provided in this application with reference to FIG. 4.

As shown in FIG. 4, a topology diagram of the circuit is shown by using that a mobile phone drives a speaker by using an SPA as an example.

The circuit includes a dual-series battery, a 2:1 charge pump, a switch, an SPA, a speaker, and an application processor (application processor, AP), and the like. For a function and a connection manner of each component, refer to the following description:

The dual-series battery means that two groups of batteries are connected in series. Currently, more and more mobile phones use the dual-series battery to supply power for fast charging. After charging is complete, an operating voltage that can be provided is higher.

Charge pump: The charge pump is also referred to as a switched-capacitor voltage converter. The charge bump is a DC-DC (converter) that uses a "fast" or "pumping" capacitor to store energy, and efficiency of the charge pump is up to 98%.

In this embodiment of this application, when the 2:1 charge pump is used as a splitter, an output voltage of the 2:1 charge pump is a part (for example, ½) of an input voltage of the 2:1 charge bump. Therefore, when the charge pump runs in a 2:1 mode, the charge pump can convert an input voltage of 8.8 V into an output voltage of 4.4 V, and supply an appropriate voltage to a mobile phone system. It can be understood that an output voltage range of the 2:1 charge pump is usually 3.3 V to 4.4 V, where 4.4 V is half of a fully charged voltage of a battery; and a voltage of the 2:1 charge pump varies depending on the battery. In another possible implementation, the 2:1 charge pump may alternatively be replaced by another voltage converter with a step-down voltage. This is not limited in this embodiment of this application.

The switch refers to a circuit element that controls the circuit in which the switch is located to be turned on or turned off. When a switch node is "closed", it means that an electronic node is turned on and a current is allowed to flow through. When a switch is "open" (open), it means that the electronic node is not turned on and a current is not allowed to flow through. In this embodiment of this application, a specific implementation type of the switch may be that a load switch (Load switch) or a boost circuit serves as a power path selection, or the like. A switch type used in this embodiment of this application is not limited. The load switch is an electronic switch that can cut off a rated load current and a specific overload current. A boost step-up circuit is a switching direct current step-up circuit. The boost step-up circuit can not only make the output voltage higher than the input voltage, but also can control output enable, that is, the boost circuit is controlled to enable a DC-DC function to output a voltage.

In this application, the load switch is used as a switch for controlling a first circuit and a second circuit and a boost is used as a switch for controlling a third circuit is used as an example. Specifically, in this embodiment of this application, the load switch 1 and the 2:1 charge pump are connected in series to form the first circuit shown in FIG. 3. The first circuit specifically includes: A dual-series battery of 8.8 V is connected in series with the 2:1 charge pump, and then is connected in series with the load switch 1, and an output end of the load switch 1 is connected to an input end of the SPA. The second circuit specifically includes: The dual-series battery of 8.8 V is directly connected in series with a load switch 2, and an output end of the load switch 2 is connected to an output end of the SPA. The boost is disposed in the third circuit, and the third circuit specifically includes: The dual-series battery is directly connected in series with the boost, and an output end of the boost is connected to an output end of the SPA. The boost may serve as a switch on a branch circuit, or may step up a voltage of the power source and then provide a higher voltage for the SPA.

In a possible implementation, switching elements such as the load switch 1, the load switch 2, and the boost in the three operating circuits shown in FIG. 3 may be further integrated into an integrated circuit.

Smart power amplifier (Smart power amplifier, SPA): A basic function of the SPA is the same as that of a common PA; to be specific, the SPA can output a power higher than an input power to drive the load, for example, a speaker, to sound. The biggest difference between a common PA and an SPA is that a feedback function is added to the SPA; to be specific, the SPA may feed back information to the processor. The feedback information may include any one or more of the following items: an output power, an output voltage, and an output current of the power amplifier. The main principle is to model a performance parameter of the speaker and monitor voltage/current feedback of the speaker, to predict an operating state and a behavior mode of the speaker under an input audio signal by using a software algorithm, and dynamically adjust an algorithm output to drive the speaker to ensure that the speaker operates at a maximum stroke and a maximum average power for a long time under a safe range. For some sounds (low frequency sounds) with a large frequency response dynamic range, such as a drum sound or a gun sound, a frequency response dynamic range reaches 80 dB or higher. The SPA can monitor an actual stroke of the speaker, so that a compression ratio of a signal is controlled in real time, and a stroke range of the speaker is used to a maximum extent, so as to reach a dynamic range and a bass effect that cannot be reached by a conventional speaker. For some sounds (high frequency sounds) with a small frequency response dynamic range, the high frequency component is high, which causes a sound coil temperature of the speaker to increase quickly. To ensure performance on a full frequency band, a conventional audio power amplifier needs to be designed to reduce the magnification, to be specific, an output capability of the audio power amplifier needs to be limited on most frequency bands, namely, on a low frequency band.

A speaker (Speaker) is also referred to as a "horn", and is configured to convert an audio electrical signal into a sound signal. For detailed description about the speaker, refer to the foregoing descriptions of each component shown in FIG. 3. Details are not described herein.

AP: An application processor is a very large scale integrated circuit that extends audio and video functions and a dedicated interface based on a low-power CPU. Application processor chips are some chips developed for an application processing platform. These chips are mainly used on boards of various product types to form a solution.

In this embodiment of this application, the AP may be connected to an audio interface of the amplifier by using an audio bus. Types of the audio bus, the audio interface, an audio data transmission protocol, and the like are not limited in this embodiment of this application. For example, in this application, an integrated circuit built-in audio (Inter-IC Sound, I2S) bus and an I2S audio interface are used as an example for description. In addition, the AP may further be connected to the amplifier by using a signal feedback bus to detect the operating state of the speaker. In a possible implementation, the signal feedback bus may further be integrated into one bus. This is not limited in this embodiment of this application.

In this embodiment of this application, the AP may be separately connected to enable input ends of the load switch 1, the load switch 2, and the boost in the first circuit, the second circuit, and the third circuit by using different pins, so that after determining a circuit corresponding to the operating state of the speaker, the AP can control a pin corresponding to the AP to send an enable signal EN 1, EN 2, or EN 3 and a voltage control signal of the boost to an enable input end corresponding to the load switch 1, the load switch 2, or the boost 1, so as to control the corresponding first circuit, second circuit, or third circuit to operate. For example, when the load, namely, the speaker, operates at a low power, it is determined that the first circuit is operating; or when the speaker operates at a medium power, it is determined that the second circuit is operating; or when the speaker operates at a high power, it is determined that the third circuit is operating. To be specific, when the speaker outputs a high frequency sound, and in this case, the speaker needs a small driving power, and therefore it is determined that the first circuit is operating and a power source provides a low voltage for the power amplifier; or when the speaker outputs a medium frequency sound, and in this case, the speaker needs a medium driving power, and therefore it is determined that the second circuit is operating, and when the power source provides a medium voltage for the power amplifier to output the low frequency sound, it is determined that the first circuit is operating; or when the speaker outputs a low frequency sound, and in this case, the speaker needs to a high driving power, and therefore it is determined that the third circuit is operating, and the power source provides a high output voltage for the power amplifier. In this case, the AP may enable, based on an output sound of the speaker, the power source to provide an appropriate voltage for the SPA, so as to provide enough driving force to drive the speaker to sound, thereby saving unnecessary power consumption.

It should be noted that the AP may further be connected to the boost by using a voltage regulation circuit, and dynamically adjusts the third circuit, namely, an output voltage of the boost circuit based on the measured operating state of the speaker. For example, the AP may change a pulse width or a duty cycle in a pulse width modulation (Pulse width modulation, PWM) manner based on a change of a corresponding load, namely, a change of the operating state of the speaker, so as to adjust a voltage output by the boost circuit, or may control an internal register of the AP by using a data bus, so as to control an output voltage of a digital to analog converter (Digital to Analog Converter, DAC), and achieve a voltage regulation effect.

It can be understood that all components included in the topology diagram of the circuit of the audio power amplifier shown in FIG. 4 are only examples. In this embodiment of this application, models of these components are not limited, and operating parameters of all the components, such as an operating voltage, are merely examples. FIG. 4 only shows an example in which the electronic device is a mobile phone. When the electronic device is a notebook or a computer, the operating parameters of all the components shown in FIG. 4 may change, and the models of all the components may change, but basic functions and circuit connection manners of all the components remain unchanged.

Based on the foregoing descriptions about the topology diagram of the circuit of the audio power amplifier, the following describes a flowchart of a method for improving a sound play effect provided in this application.

Figure 5:
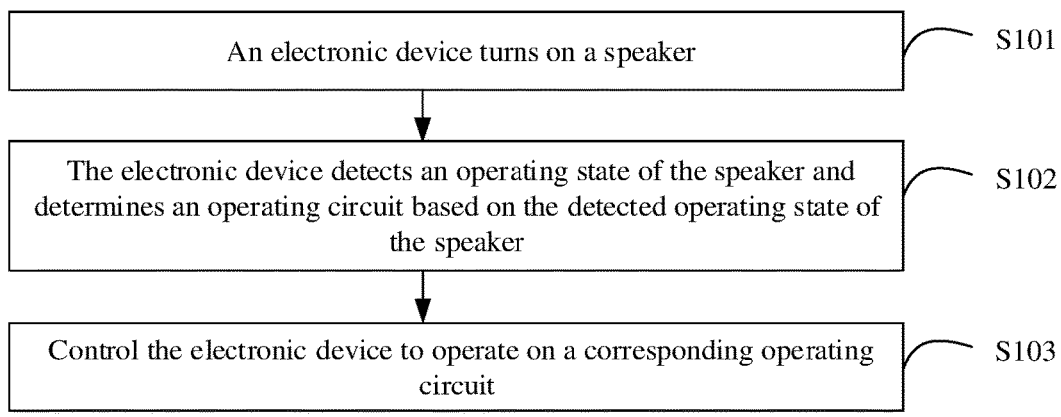
FIG. 5 is a flowchart of a method according to an embodiment of this application.

As shown in FIG. 5, the flowchart of the method specifically includes the following steps:

S101: An electronic device turns on a speaker.

In an implementation of this application, the electronic device detects a user operation, and turns on the speaker. The user operation refers to an operation that is used by the electronic device to play an audio/video file, answer a phone call, or the like, for example, tapping an audio and video application program, tapping an audio or video file, or tapping a phone call answering control.

In another implementation of this application, the electronic device does not need to receive the user operation, and automatically turns on the speaker. For example, when receiving incoming call prompt information, the electronic device may automatically play ringing music; or when detecting a to-do event added to the memo, an alarm clock, a calendar, and the like, the electronic device may automatically play prompt music or the like.

In this embodiment of this application, when the electronic device turns on the speaker, the electronic device operates on a first circuit by default. The first circuit herein is a circuit in which a load switch 1 shown in FIG. 3 is located. In this case, circuits in which a load switch 2 and a boost 1 are located are not activated and are in an inactive state. In some other embodiments of this application, a default operating circuit of the speaker may alternatively be a second operating circuit, for example, a circuit in which the load switch 2 shown in FIG. 3 is located. The default operating circuit of the speaker is not limited in this application.

S102: The electronic device detects an operating state of the speaker, and determines an operating circuit used by a power amplifier circuit based on the detected operating state of the speaker.

In this embodiment of this application, the AP is connected to an SPA, and the SPA has a feedback function; to be specific, the SPA may feed back the detected operating state of the speaker to the AP, and the AP determines an operating circuit corresponding to the operating state of the speaker based on the operating state of the speaker. The operating state of the speaker includes any one or more of the following items: an operating voltage, an operating current, an operating power, a signal-to-noise ratio, and the like of the speaker.

In this application, an output power of a power amplifier and an output audio frequency of the speaker are used as an example to describe a correspondence between the operating state and the operating circuit of the speaker.

When the output power of the power amplifier is lower than a first preset power, or the audio frequency is higher than the first preset frequency (for example, 2000 Hz), it is determined that the first circuit is operating; or when the output power of the power amplifier is lower than a second preset power and is higher than or equal to the first preset power, or the audio frequency is higher than the second frequency (for example, 800 Hz) and is lower than or equal to the first preset frequency, it is determined that the second circuit is operating; or when the output power of the power amplifier is higher than or equal to the second preset power, or when the audio frequency is lower than or equal to the second preset frequency, it is determined that the third circuit is operating.

It can be understood that values of the first preset frequency and the second preset frequency may be set by a developer based on a type of an audio service in which the electronic device provided in this application is to be used. For example, when the electronic device is specially used for pop music and rock music, because there are many drum sounds and gun sounds in such music, and audio frequencies are mainly low frequencies, values of the first frequency and the foregoing second frequency may be set to low values; or when the electronic device is specially used for folk music, and audio frequencies are mainly high frequencies, the values of the first frequency and the foregoing second frequency may be set to high values. The first preset frequency and the second preset frequency are not limited in this embodiment of this application.

In some other embodiments of this application, when the electronic device performs the foregoing step S102, after the speaker is turned on and the entire audio system is stable, the electronic device may detect the operating state of the speaker, and the electronic device may periodically detect the operating state of the speaker, for example, a period may be 10 ms. This is not limited in this application.

S103. Control the electronic device to operate on a corresponding operating circuit.

Specifically, pins of the AP may be connected to enable input ends of the load switch 1, the load switch 2, and the boost 1, so that after determining a circuit corresponding to the operating state of the speaker, the AP can control a pin corresponding to the AP to send an enable signal EN 1, EN 2, or EN 3 to an enable input end corresponding to the load switch 1, the load switch 2, or the boost 1, so as to control the corresponding first circuit, second circuit, or third circuit to operate.

When the AP controls the first circuit to operate, to be specific, a system power source is used; to be specific, an output voltage of a dual-series battery that passes through a 2:1 charge pump is used to supply power to the SPA, and the first circuit outputs a voltage of a first value, for example, 4.4 V. In this case, power source efficiency is close to 98% based on a simulation test. The power efficiency is a ratio of an output power of the power source to an input power of the power source.

When the AP controls the second circuit to operate, that is, a dual-series battery is directly used to supply power to the SPA, and the second circuit outputs a voltage of a second value, for example, 8.8 V. In this case, a simulation result shows that the power source efficiency may be close to 100%.

When the AP controls the third circuit to operate, that is, the AP supplies power to the SPA by using an output voltage of the dual-battery after step-up through the boost 1, the third circuit outputs a voltage of a third value, for example, higher than 8.8 V and lower than 15 V. In this case, the simulation result shows that the power source efficiency may be up to 93% to 95%.

In this case, the electronic device enables, based on the operating state of the speaker, different circuits to operate, and when different circuits operate, an adaptable voltage may be output, thereby reducing power consumption. For example, when the speaker outputs a bass, that is, when the speaker operates at a high power, the electronic device operates on the third circuit. In this case, an input voltage of the SPA is higher when compared with a topology diagram of a circuit of a power amplifier circuit used in FIG. 1. For a same load, that is, when the output power of the SPA is the same, it can be learned from a formula $P_{in}=V_{in}\times I_{in}$ that because an input voltage of the 8.8 V is higher than an input voltage of the 4.4 V, an operating circuit of the 8.8 V is used, a current of an energy storage element in the circuit, for example, a switching transistor (for example, a MOSFET) in a boost circuit decreases, and the power source provides more power for the SPA, so that an output power that can be provided for the speaker is higher, that is, an output capability of the SPA is improved. Compared with the topology diagram of the circuit of the power amplifier circuit shown in FIG. 1, original power efficiency may be improved from about 85% to at least 93% to 95%, thereby reducing power consumption.

It can be learned that, after the method provided in this embodiment of this application is implemented, user experience can be greatly improved, as shown below.

1. Higher Sound Quality.

An output capability of the SPA is improved, that is, a dynamic range of output of an audio signal is improved. In addition, the AP can dynamically track a state of a speaker, change an operating circuit of the SPA to adapt to an operating state of the speaker, and provide a matching input voltage for the SPA, thereby bringing better sound quality to electronic devices such as a mobile phone, a portable music player, and a tablet computer, and may further improve average music volume without exceeding a capability of the speaker.

2. Thicker Bass

In a frequency range (20 Hz to 20 kHz) that can be heard by humans, people also experience different sounds on different frequency bands, which may be specifically divided into thickness (20 Hz to 200 Hz), strength (200 Hz to 800 Hz), clarity (800 Hz to 2 kHz), brightness (2 kHz to 5 kHz), transparency (5 kHz or above), and the like.

Currently, among pop music, and audio and video that are usually played, energy of a low frequency sound accounts for about 70% of total audio energy, that is, a user's auditory experience is mainly the thickness and loudness of a sound. In the method provided in this application, an operating circuit that is used when the speaker outputs the low frequency sound is further improved. Specifically, the electronic device can dynamically adjust an input voltage based on a case in which the low frequency sound is output, thereby providing enough driving power for the speaker, so that a bass output by the speaker is thicker and louder.

Various implementations of this application may be combined randomly to achieve different technical effects.

All or some of the foregoing embodiments may be implemented by software, hardware, or a combination thereof. When software is used to implement the embodiments, the embodiments may be implemented completely or partially in a form of a computer program product. The computer program product includes one or more computer instructions. When the computer program instructions are loaded and executed on the computer, the procedure or functions according to this application are completely or partially generated. The computer may be a general-purpose computer, a special-purpose computer, a computer network, or another programmable apparatus. The computer instructions may be stored in a computer readable storage medium or may be transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk Solid State Disk), or the like.

A person of ordinary skill in the art may understand that all or some of the processes of the methods in the embodiments may be implemented by a computer program instructing relevant hardware. The program may be stored in a computer readable storage medium. When the program is executed, the processes in the foregoing method embodiments are performed. The foregoing storage medium includes any medium that can store program code, such as a ROM, a random storage memory RAM, a magnetic disk, or an optical disc.

In conclusion, the foregoing descriptions are only embodiments of the technical solutions of the present invention, and are not intended to limit the protection scope of the present invention. Any modifications, equivalent replacements, improvements, or the like made based on the disclosure of this application shall fall within the protection scope of this application.

The foregoing embodiments are merely used to describe the technical solutions of this application, but are not limited thereto. Although this application is described in detail with reference to the foregoing embodiments, a person of ordinary skill in the art should understand that the foregoing embodiments may still modify the technical solutions described in the foregoing embodiments, or perform equivalent replacement on some of the technical features. However, these modifications or replacements do not leave the essence of the corresponding technical solutions out of the scope of the technical solutions in the embodiments of this application.

The invention claimed is:

1. An electronic device, comprising:
a power source;
a processor;
a voltage regulator comprising a first circuit, a second circuit, and a third circuit;
a power amplifier; and
a speaker;
wherein the power source and the processor are separately connected to the voltage regulator, the processor is further connected to the power amplifier, the voltage regulator is connected to the power amplifier, and the power amplifier is connected to the speaker;
wherein the power source is configured to output a first voltage to the voltage regulator;
wherein the processor is configured to input an audio electrical signal to the power amplifier, and control, based on an audio frequency, the voltage regulator to adjust the first voltage to a second voltage and output the second voltage to the power amplifier, and the audio frequency is negatively correlated with the second voltage;
wherein values of the second voltage comprise a first value, a second value, and a third value, wherein the second value is higher than the first value, and wherein the third value is higher than the second value;
wherein the first circuit is configured to adjust the first voltage to have a value that is about equal to the first value of the second voltage;
wherein the second circuit is configured to adjust the first voltage to have a value that is about equal to the second value of the second voltage;
wherein the third circuit is configured to adjust the first voltage to have a value that is about equal to the third value of the second voltage;
wherein the processor being configured to control the voltage regulator to adjust the first voltage to the second voltage comprises the processor being configured to control the third circuit of the voltage regulator to operate in response to the audio frequency being lower than or equal to a second preset frequency by controlling the third circuit to operate based on the audio frequency and using a pulse width modulation method or by controlling a register inside the processor;
wherein the power amplifier is configured to amplify an output power of the audio electrical signal under driving of the second voltage, and the second voltage is positively correlated with the output power; and
wherein the speaker is configured to convert the amplified audio electrical signal into an audio signal.

2. The electronic device of claim 1,
wherein the processor being configured to control the voltage regulator to adjust the first voltage to the second voltage and provide the second voltage for the power amplifier comprises:
the processor being configured to control, in response to the audio frequency being higher than a first preset frequency, the first circuit of the voltage regulator to operate.

3. The electronic device of claim 2, wherein the first value is equal to half of a first voltage value, the second value is equal to the first voltage value, and the third value is greater than the first voltage value.

4. The electronic device of claim 2, wherein:
the first circuit comprises a charge bump and a first switch, and the charge bump is connected in series with the first switch, and the processor is configured to control the first switch to be turned on when the audio frequency is higher than the first preset frequency;
the second circuit comprises a second switch, and the processor is configured to control the second switch to be turned on when the audio frequency is lower than or equal to the first preset frequency and is higher than the second preset frequency; and
the third circuit comprises a boost circuit, and the processor is configured to control the boost circuit to be turned on when the audio frequency is lower than or equal to the second preset frequency.

5. The electronic device of claim 4, wherein the charge bump is a 2:1 charge bump, the 2:1 charge bump is configured to adjust the first voltage to the second voltage of the first value, and the first value is half of a first voltage value.

6. The electronic device of claim 1,
wherein the processor is configured to control the voltage regulator to adjust the first voltage to the second voltage and provide the second voltage for the power amplifier comprises:
the processor being configured to control, in response to the audio frequency being lower than or equal to a first preset frequency and higher than the second preset frequency, the second circuit of the voltage regulator to operate.

7. The electronic device of claim 6, wherein when the audio frequency is lower than the second preset frequency, the audio frequency is negatively correlated with the third value.

8. A method, applied to an electronic device, and the electronic device comprises a power source, a processor, a voltage regulator, a power amplifier, and a speaker, wherein the power source and the processor are separately connected to the voltage regulator, wherein the voltage regulator comprises a first circuit, a second circuit, and a third circuit, wherein the processor is further connected to the power amplifier, and wherein the voltage regulator is connected to the power amplifier, and the power amplifier is connected to the speaker; and
wherein the method comprises:
outputting, by the power source, a first voltage to the voltage regulator;

inputting, by the processor, an audio electrical signal to the power amplifier, and controlling, based on an audio frequency, the voltage regulator to adjust the first voltage to a second voltage and output the second voltage to the power amplifier, wherein the audio frequency is negatively correlated with the second voltage, wherein values of the second voltage comprise a first value, a second value, and a third value, and wherein the second value is higher than the first value, and wherein the third value is higher than the second value; wherein the controlling the voltage regulator to adjust the first voltage to the second voltage comprises controlling, by the processor, the third circuit of the voltage regulator to operate in response to the audio frequency being lower than or equal to a second preset frequency by controlling the third circuit to operate based on the audio frequency and using a pulse width modulation method or by controlling a register inside the processor;

performing, based on the audio frequency, at least one of:
  adjusting, by the first circuit, the first voltage to have a value that is about equal to the first value of the second voltage;
  adjusting, by the second circuit, the first voltage to have a value that is about equal to the second value of the second voltage; or
  adjusting, by the third circuit, the first voltage to have a value that is about equal to the third value of the second voltage;
amplifying, by the power amplifier, an output power of the audio electrical signal under driving of the second voltage, wherein the second voltage is positively correlated with the output power; and
converting, by the speaker, the amplified audio electrical signal into an audio signal.

9. The method of claim 8,
wherein controlling, by the processor, the voltage regulator to adjust the first voltage to the second voltage and output the second voltage for the power amplifier comprises:
  controlling, by the processor based on the audio frequency being higher than a first preset frequency, the first circuit of the voltage regulator to operate.

10. The method of claim 9, wherein the first value is equal to half of a first voltage value, the second value is equal to the first voltage value, and the third value is greater than the first voltage value.

11. The method of claim 9, wherein:
the first circuit comprises a charge bump and a first switch, and the charge bump is connected in series with the first switch, and the processor is configured to control the first switch to be turned on when the audio frequency is higher than the first preset frequency;
the second circuit comprises a second switch, and the processor is configured to control the second switch to be turned on when the audio frequency is lower than or equal to the first preset frequency and is higher than the second preset frequency; and
the third circuit comprises a boost circuit, and the processor is configured to control the boost circuit to be turned on when the audio frequency is lower than or equal to the second preset frequency.

12. The method of claim 11, wherein the charge bump is a 2:1 charge bump, the 2:1 charge bump is configured to adjust the first voltage to the second voltage of the first value, and the first value is half of a first voltage value.

13. The method of claim 8,
wherein controlling, by the processor, the voltage regulator to adjust the first voltage to the second voltage and output the second voltage for the power amplifier comprises:
  controlling, by the processor based on the audio frequency being lower than or equal to a first preset frequency and being higher than the second preset frequency, the second circuit of the voltage regulator to operate.

14. The method of claim 13, wherein when the audio frequency is lower than the second preset frequency, the audio frequency is negatively correlated with the third value.

15. A non-transitory computer readable storage medium, wherein the non-transitory computer readable storage medium stores instructions that are operable on electronic device, wherein the electronic device comprises a power source, a processor, a voltage regulator, a power amplifier, and a speaker, wherein the power source and the processor are separately connected to the voltage regulator, wherein the voltage regulator comprises a first circuit, a second circuit, and a third circuit, wherein the processor is further connected to the power amplifier, wherein the voltage regulator is connected to the power amplifier, wherein the power amplifier is connected to the speaker, and wherein, when executed by the electronic device, the instructions cause the electronic device to perform operations comprising:
  outputting, by the power source, a first voltage to the voltage regulator;
  inputting, by the processor, an audio electrical signal to the power amplifier, and controlling, based on an audio frequency, the voltage regulator to adjust the first voltage to a second voltage and output the second voltage to the power amplifier, wherein the audio frequency is negatively correlated with the second voltage, wherein the controlling the voltage regulator to adjust the first voltage to the second voltage comprises controlling, by the processor, the third circuit of the voltage regulator to operate in response to the audio frequency being lower than or equal to a second preset frequency by controlling the third circuit to operate based on the audio frequency and using a pulse width modulation method or by controlling a register inside the processor;
  amplifying, by the power amplifier, an output power of the audio electrical signal under driving of the second voltage, wherein the second voltage is positively correlated with the output power; and
  converting, by the speaker, the amplified audio electrical signal into an audio signal.

16. The non-transitory computer readable storage medium of claim 15,
wherein controlling, by the processor, the voltage regulator to adjust the first voltage to the second voltage and output the second voltage for the power amplifier comprises:
  controlling, by the processor based on the audio frequency being higher than a first preset frequency, the first circuit of the voltage regulator to operate.

* * * * *

UNITED STATES PATENT AND TRADEMARK OFFICE
CERTIFICATE OF CORRECTION

| | | |
|---|---|---|
| PATENT NO. | : 12,500,554 B2 | Page 1 of 1 |
| APPLICATION NO. | : 17/999527 | |
| DATED | : December 16, 2025 | |
| INVENTOR(S) | : Jing Zhao | |

It is certified that error appears in the above-identified patent and that said Letters Patent is hereby corrected as shown below:

In the Claims

In Column 22, in Claim 15, Line 20, delete "on" and insert -- on an --.

Signed and Sealed this
Tenth Day of February, 2026

John A. Squires
*Director of the United States Patent and Trademark Office*